(12) United States Patent
Bortolato et al.

(10) Patent No.: US 11,369,042 B2
(45) Date of Patent: Jun. 21, 2022

(54) HEAT EXCHANGER WITH INTEGRATED TWO-PHASE HEAT SPREADER

(71) Applicant: ABB Schweiz AG, Baden (CH)

(72) Inventors: Matteo Bortolato, Zurich (CH); Bruno Agostini, Zurich (CH); Daniele Torresin, Baden (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 16/842,786

(22) Filed: Apr. 8, 2020

(65) Prior Publication Data

US 2020/0329584 A1 Oct. 15, 2020

(30) Foreign Application Priority Data

Apr. 10, 2019 (EP) ..................... 19168520

(51) Int. Cl.
*H05K 7/20* (2006.01)
*F28D 15/02* (2006.01)
*F28D 15/04* (2006.01)

(52) U.S. Cl.
CPC ....... *H05K 7/20336* (2013.01); *F28D 15/025* (2013.01); *F28D 15/043* (2013.01); *H05K 7/20309* (2013.01); *H05K 7/20318* (2013.01)

(58) Field of Classification Search
CPC ............... F28D 15/0233; F28D 15/046; F28D 15/0275; F28D 15/04; F28D 15/043; F28D 15/0283; F28D 15/025; H05K 7/20336; H05K 7/20318; H05K 7/20309; H05K 1/0203; H05K 7/20936; H05K 7/20436; H05K 7/20245
See application file for complete search history.

(56) References Cited

U.S. PATENT DOCUMENTS

| | | | |
|---|---|---|---|
| 5,283,715 A | 2/1994 | Carlsten et al. | |
| 7,796,389 B2 | 9/2010 | Edmunds et al. | |
| 9,389,022 B2 | 7/2016 | Agostini et al. | |
| 2003/0000721 A1 | 1/2003 | Garner | |
| 2006/0096740 A1* | 5/2006 | Zheng | F28D 15/0233 165/104.26 |
| 2010/0128436 A1* | 5/2010 | Edmunds | F28D 15/0233 361/700 |
| 2010/0252237 A1 | 10/2010 | Hashimoto et al. | |
| 2010/0315781 A1* | 12/2010 | Agostini | F28D 15/0266 361/700 |
| 2011/0127011 A1* | 6/2011 | Agostini | F28F 1/022 165/104.21 |
| 2012/0111553 A1* | 5/2012 | Tsoi | H05K 7/20336 165/185 |

(Continued)

FOREIGN PATENT DOCUMENTS

| | | |
|---|---|---|
| EP | 2031332 B1 | 9/2010 |
| EP | 2568789 A2 | 3/2013 |

(Continued)

*Primary Examiner* — Adam B Dravininkas
(74) *Attorney, Agent, or Firm* — Leydig, Voit & Mayer, Ltd.

(57) ABSTRACT

A heat exchanger includes: a baseplate having a first side and a second side opposite the first side, the first side being coupled to a thermosiphon, one or more electronic components being mounted on the second side. The baseplate has a two-phase heat spreading structure. In an embodiment, the heat exchanger includes a thermosiphon.

14 Claims, 5 Drawing Sheets

(56) References Cited

U.S. PATENT DOCUMENTS

| | | | |
|---|---|---|---|
| 2013/0077245 A1* | 3/2013 | Gradinger | F28D 15/0266 |
| | | | 361/700 |
| 2015/0136358 A1* | 5/2015 | Gradinger | H01L 23/427 |
| | | | 165/80.3 |
| 2017/0013747 A1* | 1/2017 | Agostini | F28D 15/0266 |
| 2017/0059253 A1* | 3/2017 | Laurila | F28F 1/022 |
| 2017/0112022 A1* | 4/2017 | Shoji | H01L 21/4882 |
| 2017/0181319 A1* | 6/2017 | Agostini | H05K 7/20318 |

FOREIGN PATENT DOCUMENTS

| | | |
|---|---|---|
| EP | 2887788 A2 | 6/2015 |
| EP | 3203512 A1 | 8/2017 |

* cited by examiner

Detail A

HEAT EXCHANGER WITH INTEGRATED TWO-PHASE HEAT SPREADER

CROSS-REFERENCE TO PRIOR APPLICATION

Priority is claimed to European Patent Application No. EP 19 168 520.5, filed on Apr. 10, 2019, the entire disclosure of which is hereby incorporated by reference herein.

FIELD

The present invention relates to a heat exchanger comprising a baseplate with a two-phase heat spreading structure.

BACKGROUND

In power electronics, passive heat exchangers are common. Heat exchangers usually comprise closed structures as, e.g., channels, which were evacuated and filled partly with a cooling fluid. The thermal energy from a heat source as, for example, an electronic power device mounted on a baseplate is received by the baseplate, which is in contact with a heat exchanger. The heat exchanger comprises an evaporation zone where the coolant is evaporated, and the thermal energy is transported by the vapor to colder parts of the structure, where the coolant condenses and flows back on one hand and where the thermal energy is emitted on the other hand. Different types of heat exchangers exist.

Thermosiphons and pulsating heat pipe-based heat exchangers are simple and reliable solutions that extend the use of air as cooling medium in power electronics, before resorting to water-cooling. Despite significant improvements compared to finned heat sinks, when increasing the total power and the heat losses of the devices, heat spreading on the baseplate becomes a limiting factor. At the nominal heat load, the maximum temperature difference on the baseplate can reach 10-15 K. The smaller the area of the heat sources as compared to the baseplate area, the higher this temperature difference. At some point, when increasing the power beyond nominal conditions, the critical heat flux is reached. At the working limit of the heat exchanger, due to the onset of the dry-out, the maximum baseplate temperature difference can rise up to 40 K. This reveals that critical conditions have been established only in the region of the evaporator corresponding to the positions of the heat sources on the baseplate. Improving the heat spreading on the baseplate would lead to a more efficient exploitation of the thermosiphon or of the pulsating heat pipe working principle.

SUMMARY

In an embodiment, the present invention provides a heat exchanger, comprising: a baseplate having a first side and a second side opposite the first side, the first side being coupled to a thermosiphon, one or more electronic components being mounted on the second side, wherein the baseplate comprises a two-phase heat spreading structure.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Therefore, a more effective heat exchanger is desired to provide cost-effective solutions.

The described embodiments similarly pertain to the heat exchanger and to the method for producing the heat exchanger. Synergetic effects may arise from different combinations of the embodiments although they might not be described in detail.

Technical terms are used by their common sense. If a specific meaning is conveyed to certain terms, definitions of terms will be given in the following in the context of which the terms are used.

According to a first aspect, a heat exchanger is provided, comprising a baseplate having a first side and a second side opposite to the first side. The first side is configured for being coupled to a thermosiphon, that is, a thermosiphon may be coupled to the first side. The second side is configured for mounting electronic components and the baseplate comprises a two-phase heat spreading structure. That is, one or more components may be mounted on the second side. The baseplate therefore absorbs the heat from the heat sources and the thermosiphon, which in this case is a base-to-air thermosiphon, is attached to the baseplate. The base-to-air thermosiphon is filled in the common way with a cooling fluid, which is called "primary fluid" in this disclosure. Under the term thermosiphon also a pulsating heat pipe or other types of heat pipes may be understood in a broad way. Thermosiphons and pulsating heat pipes are based on wickless heat pipes. The principle difference between thermosiphons and pulsating heat pipes is that a pulsating heat pipe works also if it is not gravity assisted, e.g., when horizontally oriented. Similar to the thermosiphon, the structure of the baseplate allows for filling the inside of the baseplate with a cooling fluid so that the structure comprises a liquid secondary fluid, representing a first phase and the evaporated secondary fluid representing the second phase when in use. Due to the two-phase structure the heat is spread nearly uniformly over the first side of the baseplate resulting in an effective dissipation of the heat by the thermosiphon and avoids excessive temperature at the heat source on the first side and the second side of the baseplate.

According to an embodiment, the heat exchanger further comprises a thermosiphon.

According to an embodiment, the baseplate further comprises side spacing bars and a metallic lid to obtain at least one cavity; and support elements inside the cavity. The metallic lid forms the second side of the baseplate. It may include holes for the mechanical connections of the power devices. The cavity and the support elements may form a chamber or channels as described in the following embodiments.

According to an embodiment, the baseplate is machined to realize at least a volume; and wherein the lid is flat and coupled with the machined volume.

According to an embodiment, the two-phase heat spreading structure is a vapor chamber comprising an evaporator and a condenser, wherein the evaporator is situated adjacent to a region intended for mounting an electrical component, and the condenser is situated adjacent to a region which is not intended for mounting an electronic component.

According to an embodiment, the at least one condenser and at least one evaporator are formed by stir friction welding created capillary channels.

A vapor chamber is a kind of planar heat pipe, which can spread heat in two dimensions and is suited for high powers and heat fluxes that are applied to a relatively small evaporator area. The vaporized fluid disperses throughout the chamber, creating an isothermal heat spreader and condenses on the surfaces of the condenser. Thus, the heat is distributed uniformly over the inner baseplate surface in contact with the condenser and therefore also with the outer baseplate surface in contact with the thermosiphon, which dissipates the heat. To ensure the proper circulation of the liquid phase, a vapor chamber is provided with wick structure.

At the evaporator, that is, the part of the vapor chamber, where the fluid inside the vapor chamber evaporates, the wick structure may be formed using different structures or materials. The inner surface of the lid, in contact with the secondary fluid may include additional wick structures to enhance the two-phase heat transfer mechanism inside the sealed container.

According to an embodiment, the evaporator of the vapor chamber comprises a porous evaporator wick, a mesh wick, grooves, or a combination of these, embedded into the baseplate. The wick structure may be realized, for example, by sintering from metal powder or by metal additive manufacturing, e.g., 3-D printing, at both in the cavity of the baseplate and on the inner surface of the metallic lid. The inner surface of the metallic lid may be porous and have some contact points with the metal additive in the cavity after assembly.

The flow of the liquid phase from the condenser to the evaporator may also be achieved by inserting offset strip fins or perforated fins. The choice between porous, grooved or meshed evaporator depends on the inclination angle and the heat flux.

According to an embodiment, the two-phase heat spreading structure is a pulsating heat pipe comprising at least an evaporator region and at least one condenser region, wherein the condenser is situated adjacent to a region which is not intended for mounting an electronic component.

According to an embodiment, the at least one condenser region and the at least one evaporator region are formed by stir friction welding created capillary channels. For example, if the baseplate material is aluminum, a stir friction welding process is an economic and efficient method for producing the channels in the baseplate.

According to an embodiment, the at least one condenser region and the at least one evaporator region are machining-created and comprise a closing lid. The parts may be arranged according to their final composition and joined together in a one-shot oven brazing process.

According to an embodiment, the at least one condenser region and the at least one evaporator region are formed by multiport extruded tubes connected at their ends. Multiport extruded tubes consist of extruded rectangular flat tubes with multiple small channels running the length of the tubes. They have a large internal surface area, so that they achieve an efficient heat transfer and hence the heat is spread in highly effective in the baseplate.

According to an embodiment, the heat spreading structure is a capillary loop heat pipe comprising a capillary evaporator, which is embedded into the baseplate, wherein the capillary evaporator is situated below the at least one location for heat sources and the at least one condenser channel is situated aloof from the at least one location for heat sources. Capillary loop heat pipes the vapor generated in the evaporator is flowing to the condenser channels in one part of the loop and the condensed liquid in the condensing channel, is flowing back to the evaporator in the other part of the loop, so that an effective heat spreading is obtained in the baseplate. As an example, the capillary loop heat pipe can be made of multiport extruded pipes properly connected at their ends.

According to a second aspect, a method of producing a heat exchanger comprising a baseplate and a thermosiphon as describe above.

For example, the method provides at least an evaporator region and at least one condensing region for a working fluid in the baseplate. Furthermore, side spacing bars to obtain at least one cavity and support elements in the cavity are provided. The at least one evaporator region 1 and at least one condensing region are arranged according to a pulsating heat pipe configuration. The evaporator region and the at least one condensing region are, for example, created using a stir friction welding process. Alternatively, the evaporator region and the least one condensing region may be created using machining and the method may further comprise: providing a closing lid for closing the evaporator region and the least one condensing region. As a further alternative, the evaporator region and at least one condensing region are created using multiport extruded tubes, All parts of the heat exchanger may be joined in performing a one-shot brazing process. According to an example, the method further comprises: charging the working fluid into the evaporator region and the least one condensing region. Further features of the method can be learnt from the embodiments referring to the heat exchanger described above.

Figure 1:
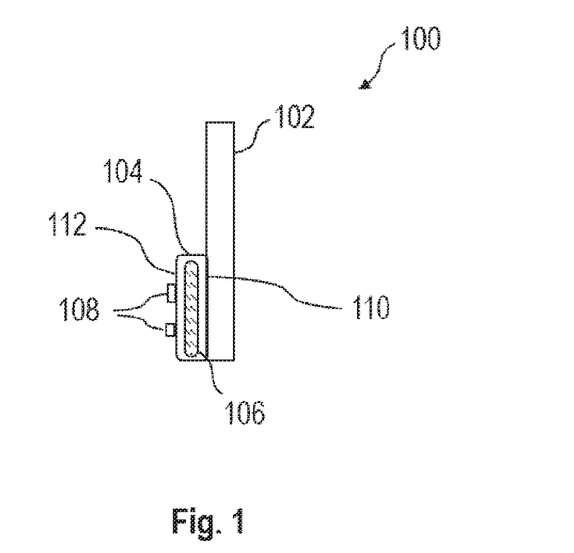
FIG. 1 shows a structural diagram of a heat exchanger according to an embodiment.

FIG. 1 shows a heat exchanger 100 according to an embodiment with a baseplate 104, a thermosiphon 102 and a two-phase heat spreading structure 106. Heat is generated by the electronic devices 108 and transferred to the two-phase heat spreading structure 106, that spreads the heat around the spots where the devices 108 are mounted at the second side 112 of the baseplate 104 uniformly to the first side 110 of the baseplate 104, where the thermosiphon 102 is arranged.

The baseplate 104, thus, is not a solid plate but has an integrated sealed container forming a 2-D heat-spreading structure. The heat-spreading structure is filled with a secondary cooling fluid. Similar to the base to air thermosiphon, the secondary cooling fluid in the baseplate adopts two phases, namely a gaseous and a liquid phase. The secondary fluid evaporates on the inner side of the surface in the region where the power devices are mounted, while it condenses on the inner side of the surface in contact with the primary fluid pipes. This entails a uniform temperature distribution on the primary fluid pipes and allows the entire primary fluid region to take effective part in heat removal. As a result, the thermal resistance significantly decreases.

Heat exchangers based on loop thermosiphon or pulsating heat pipe for cooling electronic devices include at least one pipe for a primary working fluid in thermal contact with the metallic bulk baseplate. The part of the at least one pipe in contact with the baseplate acts as evaporator of the fluid. On the external surface of the baseplate, electronic devices are mounted. The working limit occurs when, at a given heat flux, critical conditions are reached in the evaporator part corresponding to the positions of the electrical devices, while the peripheral regions of the evaporator are colder. This is due to the limit of the conductive heat transfer in the metallic baseplate.

Electrical devices with higher power can be installed on the same baseplate integrating on it a sealed container including a secondary working fluid under two-phase saturation conditions. This structure allows much more uniform heat spreading over the entire evaporator, leading to lower thermal resistance and to higher efficiency in heat removal for the same geometry of heat exchanger.

Thus, the proposed baseplate is machined to realize at least a volume for the secondary fluid. Some additional elements are inserted in this volume such as:

a structure to allow and enhance the passive circulation of vapor and liquid phases of the secondary two-phase fluid; supports elements which may also enable the mounting of the power devices through appropriate mechanical connections (e.g. internally threaded).

A flat lid is coupled with the machined volume to form the mentioned sealed container. The lid may include holes for the mechanical connections of the power devices. The inner surface of the lid, in contact with the secondary fluid may include additional structures (e.g. grooves or other wick structures) to enhance the two-phase heat transfer mechanism inside the sealed container. The container is designed to include at least one charging tube that is needed to introduce the secondary fluid. To maintain good performance, the design of the two-phase heat spreader integrated in the baseplate may be flexibly adapted to the orientation of the heat exchanger. The proposed solution is envisaged to adopt a cost-effective manufacturing process where all the parts of the heat exchanger are joined eventually in one-shot brazing process. This ensures an excellent thermal contact.

The conceived solution is a 2-D heat spreader, based on a two-phase heat transfer mechanism and manufactured through an efficient and flexible process.

Figure 2:
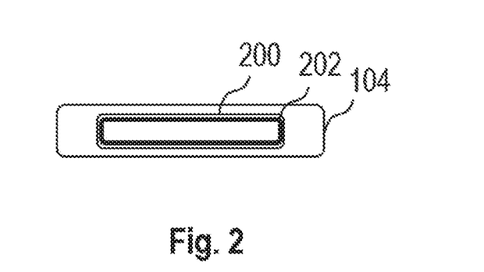
FIG. 2 shows a structural diagram of a vapor chamber in the baseplate of a heat exchanger according to an embodiment.

FIG. 2 shows a vapor chamber 200 integrated in the baseplate 104. The vapor chamber may comprise a wick 202, which extends over the evaporator on the bottom side and over the condenser at the top side. The condensed fluid is drawn back to the evaporator through the wick 202 while vapor flows in the empty spaces.

FIG. 3-FIG. 6 show examples of a two-phase heat spreading structure 106. In a first example illustrated in FIG. 3, the baseplate's metallic lids 302, 306 are machined or provided with side spacing bars 308 to obtain at least one cavity where support elements 310 and enhanced surface geometries 304 are positioned. These geometries 304 may be offset strip fins or perforated fins. The fins 304 have holes 310 for the arrangement of the support elements 304.

Figure 3:
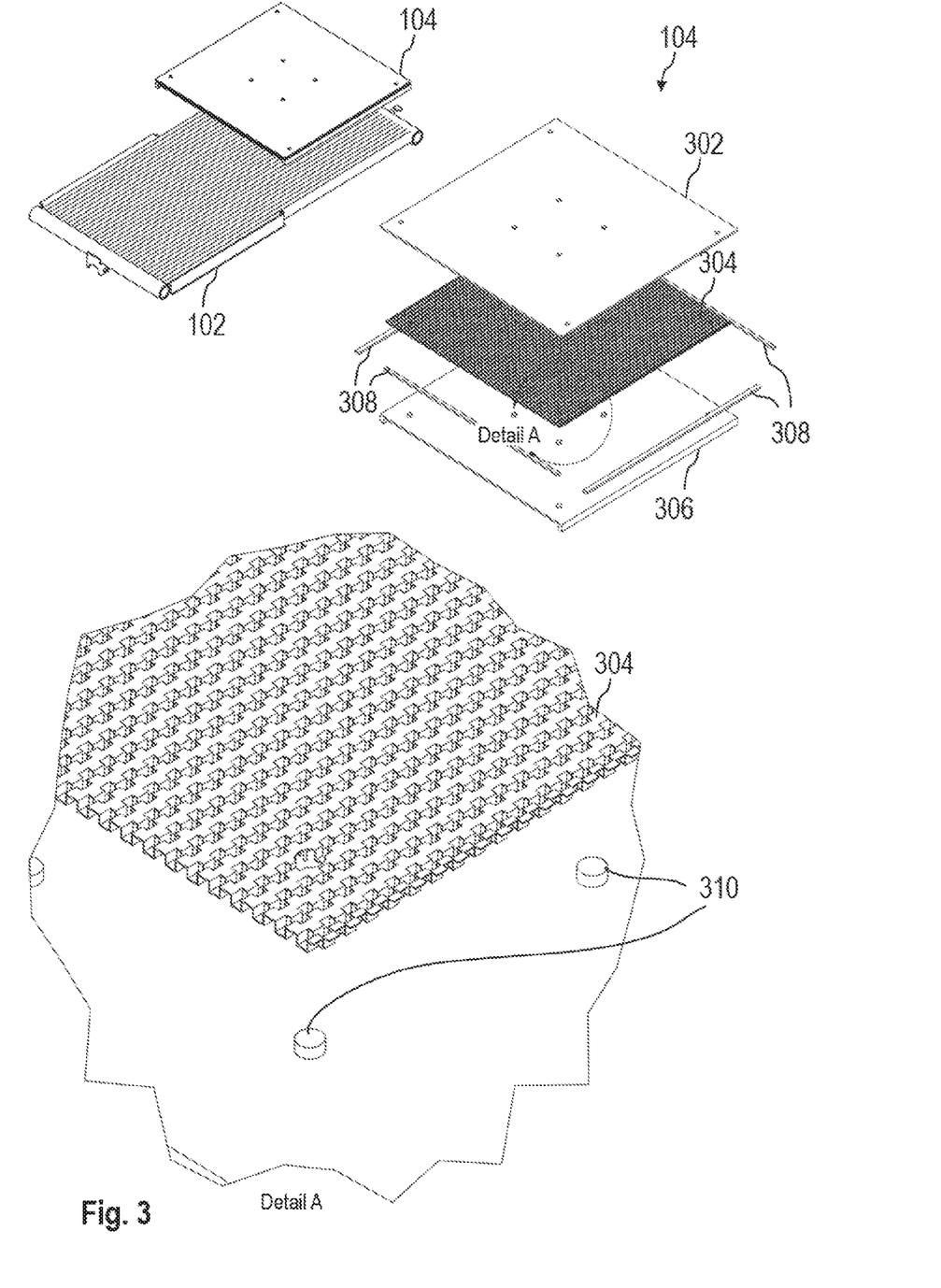
FIG. 3 shows a first structure of a baseplate with offset strip fins and support elements according to an embodiment.

The whole heat exchanger 100 can be obtained using the plate and bar manufacturing technology. After the one-shot brazing, the primary and secondary fluid are charged. Considering the secondary fluid, the vapor flows occur in the empty spaces while the liquid flow occurs along the fins' frame. Preferably, the evaporator and the condenser are provided with wick structures to favor the liquid flow.

Figure 4:
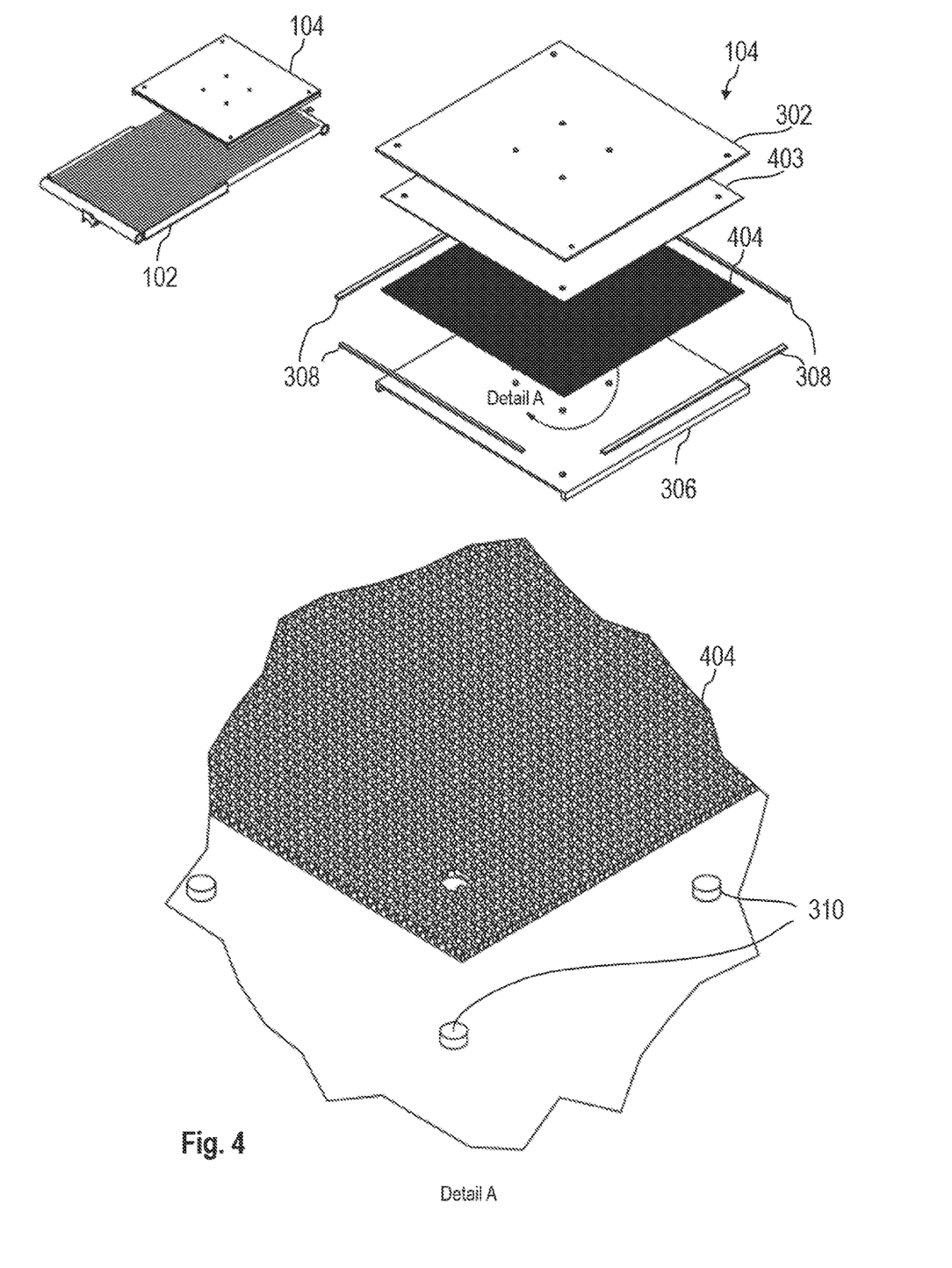
FIG. 4 shows an aluminum foam sandwich structure according to an embodiment.

In other examples, the fins 304 are replaced alternatively:

With an aluminum foam sandwich structure 302, 403, 404, 306 as illustrated in FIG. 4, preferably, with some empty spaces for vapor flow or with one or more aluminum foam structures 404 provided with an aluminum sheet 403 on one side. In the latter case, after assembly, the foam structures 404 have some contact points so that liquid flow paths are defined and free volumes are available for the vapor flow.

In another example, the fins 404 are replaced with a structure realized by metal additive manufacturing both in the cavity of the baseplate between metallic lids 302, 306 and in the inner surface of the metallic lid 302. Preferably, the latter structure is porous and the two structures have some contact points after assembly.

Figure 5:
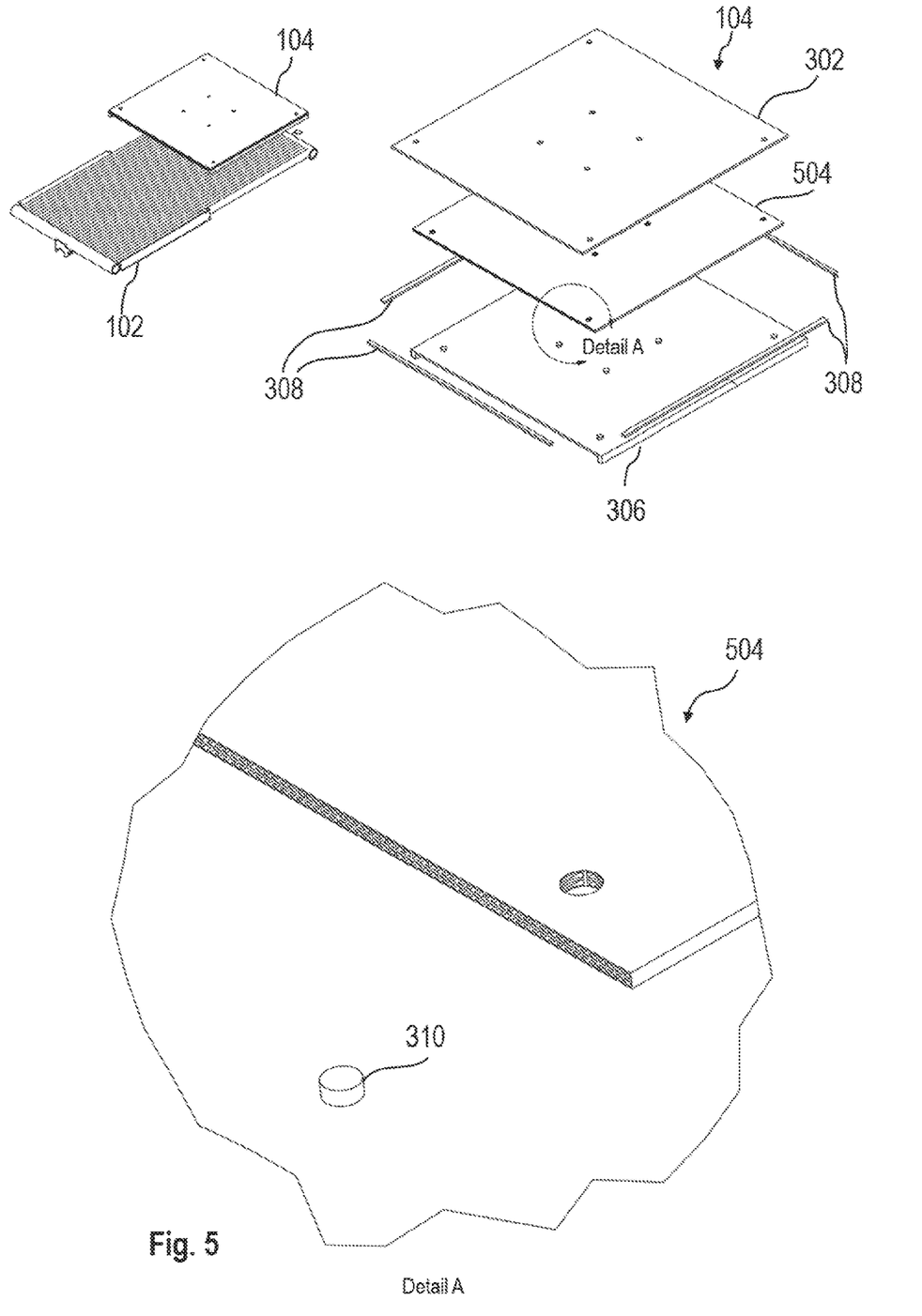
FIG. 5 shows a multiport extruded tubes structure of a baseplate according to an embodiment.

In a further example, the fins are replaced with a structure 504 made of parallel small channels or of several layers of parallel channels as shown in FIG. 5. Each layer may consist of several multiport extruded tubes. All the channels' ends are connected in a manifold.

Figure 6:
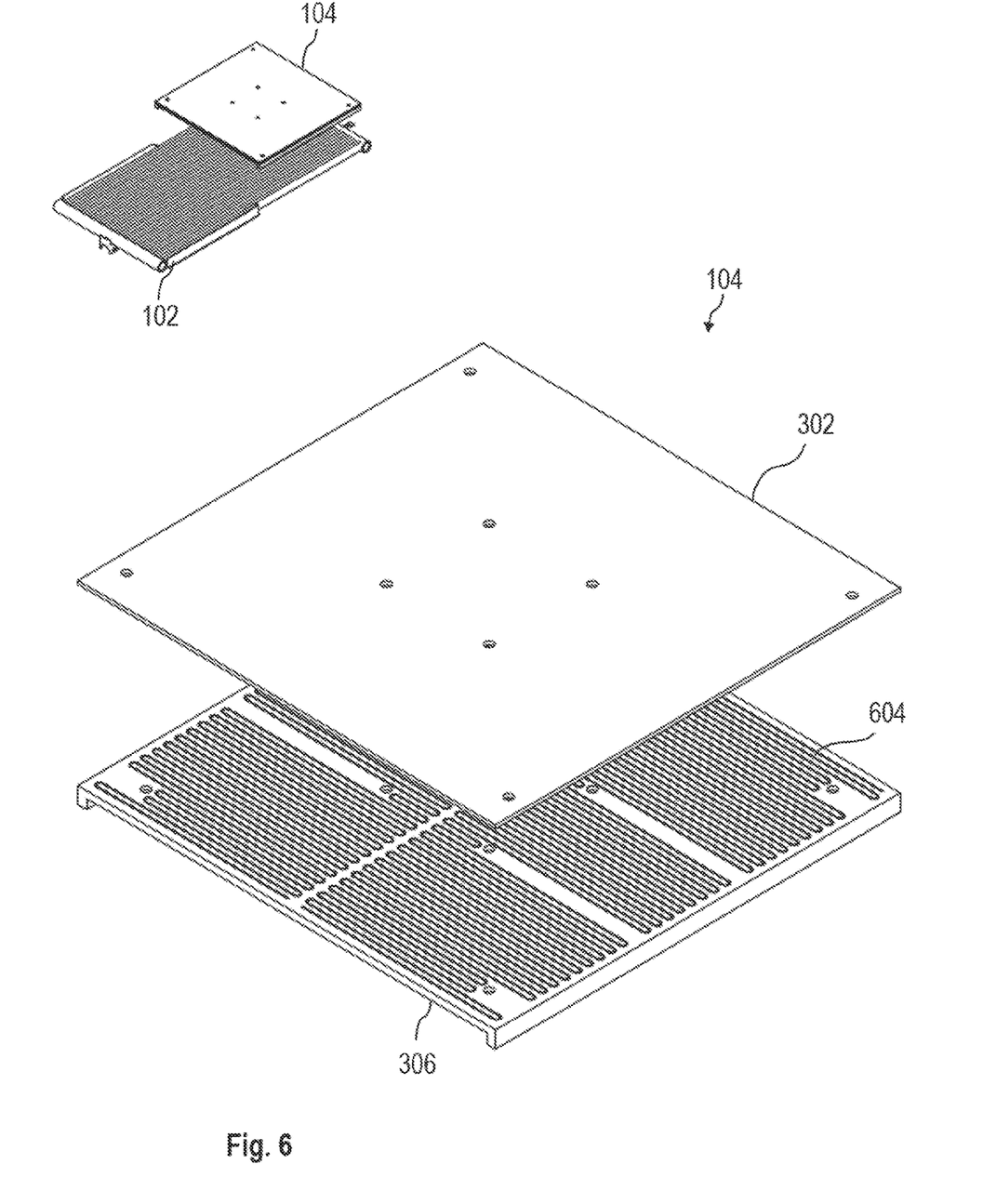
FIG. 6 shows a structure with meandering channel of a baseplate according to an embodiment.

In another example, the volume for the secondary fluid is a meandering channel 604 with capillary dimensions designed in an open or closed loop configuration as shown in FIG. 6. This channel can be obtained by using end milling or welding stir friction technique on the baseplate 104. The embedded two-phase heat spreader in this case works as a pulsating heat pipe, and condensation occurs in the peripheral part of the baseplate 104.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A heat exchanger, comprising:
   a baseplate having a first side and a second side opposite the first side, the first side being coupled to a thermosiphon, one or more electronic components being mounted directly on the second side,
   wherein the baseplate comprises a two-phase heat spreading structure.

2. The heat exchanger according to claim 1, further comprising the thermosiphon.

3. The heat exchanger according to claim 1, wherein the baseplate comprises side spacing bars and a metallic lid of the baseplate to provide at least one cavity,
wherein support elements are disposed inside the cavity, and
wherein the metallic lid forms the second side of the baseplate.

4. The heat exchanger according to claim 1, wherein the baseplate is machined to provide at least a machined volume, and
wherein a lid of the baseplate is flat and coupled with the machined volume.

5. The heat exchanger according to claim 1, wherein the two-phase heat spreading structure comprises a vapor chamber comprising an evaporator and a condenser,
wherein the evaporator is situated adjacent to a region configured to mount the one or more electrical components and the condenser is situated adjacent to a region which is not configured to mount any of the one or more electronic component.

6. The heat exchanger according to claim 5, wherein the at least one condenser and the at least one evaporator comprise stir friction welding created capillary channels.

7. The heat exchanger according to claim 5, wherein the at least one condenser and the at least one evaporator are machining-created and comprise a closing lid.

8. The heat exchanger according to claim 5, wherein the at least one condenser and the at least one evaporator comprise multiport extruded tubes, connected at ends thereof.

9. The heat exchanger according to claim 1, wherein the baseplate comprises a porous evaporator, a mesh evaporator, grooves, or a combination of these, embedded into the baseplate.

10. The heat exchanger according to claim 1, wherein the two-phase heat spreading structure comprises a pulsating heat pipe comprising at least one evaporator and at least one condenser, and
wherein the at least one condenser is situated adjacent to a region which is not configured to mount the one or more electronic components.

11. The heat exchanger according to claim 10, wherein the at least one condenser and the at least one evaporator comprise stir friction welding created capillary channels.

12. The heat exchanger according to claim 1, wherein the two-phase heat spreading structure comprises a capillary loop heat pipe comprising a capillary evaporator, which is embedded into the baseplate, and
wherein the capillary evaporator is situated adjacent to a region which is configured to mount the one or more electronic components.

13. A method of producing the heat exchanger according to claim 1.

14. The heat exchanger according to claim 1, wherein the thermosiphon is mounted on the second side of the baseplate, which defines a hole through which a support of the one or more electronic components extends.

* * * * *